(12) United States Patent
Short

(10) Patent No.: US 6,765,940 B2
(45) Date of Patent: Jul. 20, 2004

(54) ANAMORPHIC PRISM WAVELENGTH LOCKER

(75) Inventor: Bradley W. Short, Goleta, CA (US)

(73) Assignee: Agility Communications, Inc., Goleta, CA (US)

( * ) Notice: Subject to any disclaimer, the term of this patent is extended or adjusted under 35 U.S.C. 154(b) by 35 days.

(21) Appl. No.: 10/284,733

(22) Filed: Oct. 31, 2002

(65) Prior Publication Data

US 2003/0086452 A1 May 8, 2003

Related U.S. Application Data

(60) Provisional application No. 60/336,387, filed on Nov. 1, 2001.

(51) Int. Cl.[7] .............................. H01S 3/13; H01S 3/04
(52) U.S. Cl. ......................................... 372/32; 372/36
(58) Field of Search .................... 372/32, 36; 369/112, 369/44.23

(56) References Cited

U.S. PATENT DOCUMENTS

| | | | | |
|---|---|---|---|---|
| 6,108,283 A | * | 8/2000 | Fujita et al. | 369/44.23 |
| 6,122,404 A | * | 9/2000 | Barter et al. | 382/260 |
| 6,128,080 A | * | 10/2000 | Janik et al. | 356/491 |
| 6,345,060 B1 | * | 2/2002 | Copner et al. | 372/32 |
| 6,392,977 B2 | * | 5/2002 | Ando et al. | 369/112.01 |
| 2002/0012369 A1 | * | 1/2002 | Nasu et al. | 372/36 |
| 2003/0035119 A1 | * | 2/2003 | Myatt et al. | 356/519 |

\* cited by examiner

Primary Examiner—Paul Ip
Assistant Examiner—Hung T Vy
(74) Attorney, Agent, or Firm—Gates & Cooper LLP

(57) ABSTRACT

An anamorphic prism wavelength locker for a laser output beam, wherein the anamorphic prisms perform beam splitting for wavelength and power monitoring for the output beam, magnification of the output beam, and circularization of an elliptical output beam.

15 Claims, 5 Drawing Sheets

ANAMORPHIC PRISM WAVELENGTH LOCKER

CROSS-REFERENCE TO RELATED APPLICATIONS

This application claims the benefit under 35 U.S.C. §119 (e) of co-pending and commonly-assigned U.S. provisional patent application Serial No. 60/336,387, filed Nov. 1, 2001, by Bradley W. Short, and entitled "PARTIALLY MIRRORED BEAM TAP, ANAMORPHIC PRISM AND COMPACT SINGLE BEAM SPLITTER BASED WAVELENGTH LOCKERS," which application is incorporated by reference herein.

This application is related to co-pending and commonly-assigned U.S. utility patent application Ser. No. 10/784,734, filed on same date herewith, by Bradley W. Short, and entitled "PARTIALLY MIRRORED BEAM TAP FOR WAVELENGTH LOCKERS," which application is incorporated by reference herein.

BACKGROUND OF THE INVENTION

1. Field of the Invention

The invention relates to the field of wavelength lockers used in conjunction with widely tunable lasers, and more particularly, to an anamorphic prism wavelength locker.

2. Description of the Related Art

There are a variety of semiconductor laser designs in which the wavelength can be tuned by current injection into one or more sections of the laser that have some spectral filtering characteristics. Examples include moderately-tunable devices, such as distributed Bragg reflector (DBR) lasers, and widely-tunable devices, such as sampled grating distributed Bragg reflector (SGDBR) lasers.

In each of these devices, precise control of each of the currents provided to the various sections of the laser is required to achieve a desired output wavelength. The amount of current injected into each section to achieve a given wavelength can vary with both device temperature and aging. For example, over time, as the device ages, changes in leakage current and carrier lifetime in the tuning sections cause the laser output wavelength to drift. This variation in tuning characteristics requires the use of some sort of feedback control system in order for such tunable lasers to be used in applications where precise wavelength control must be maintained, such as dense wavelength division multiplexed (DWDM) communications systems.

One type of feedback control is known as a wavelength locker. A wavelength locker is used for stabilizing the laser output wavelength at one of a plurality of channels. However, prior art wavelength lockers have not been especially compact and thus are not easily integrated into laser device packaging. In addition, prior art wavelength lockers have not been very cost effective. Moreover, prior art wavelength lockers do not provide any type of output beam conditioning, for example, in order to correct irregular output beam cross-sectional configurations generated by edge-emitting diode lasers.

Therefore, there is a need in the art for a wavelength locker that is compact, so that it may be integrated into the laser packaging. In addition, there is a need in the art for a wavelength locker that is cost effective. Moreover, there is a need in the art for a wavelength locker that provides some type of output beam conditioning.

SUMMARY OF THE INVENTION

The present invention describes an anamorphic prism wavelength locker for a laser output beam, wherein the anamorphic prisms perform beam splitting for wavelength and power monitoring for the output beam, magnification of the output beam, and circularization of an elliptical output beam. The prisms may comprise an air-spaced pair of prisms or three contacted prisms.

The prisms split off at least two beams from the output beam, wherein a first split-off beam is transmitted to an etalon and a first photo-detector for wavelength monitoring, while a second split-off beam is transmitted to a second photo-detector as a reference and for power monitoring.

The prisms also expand or compress the elliptical output beam width in a first axis, while leaving the elliptical output beam width in a second axis orthogonal to the first axis unchanged, thereby generating a circularized output beam.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Many laser diodes require high fiber coupling efficiencies as well as wavelength locking. The present invention comprises an anamorphic prism wavelength locker that satisfies both of these requirements.

Figure 1:
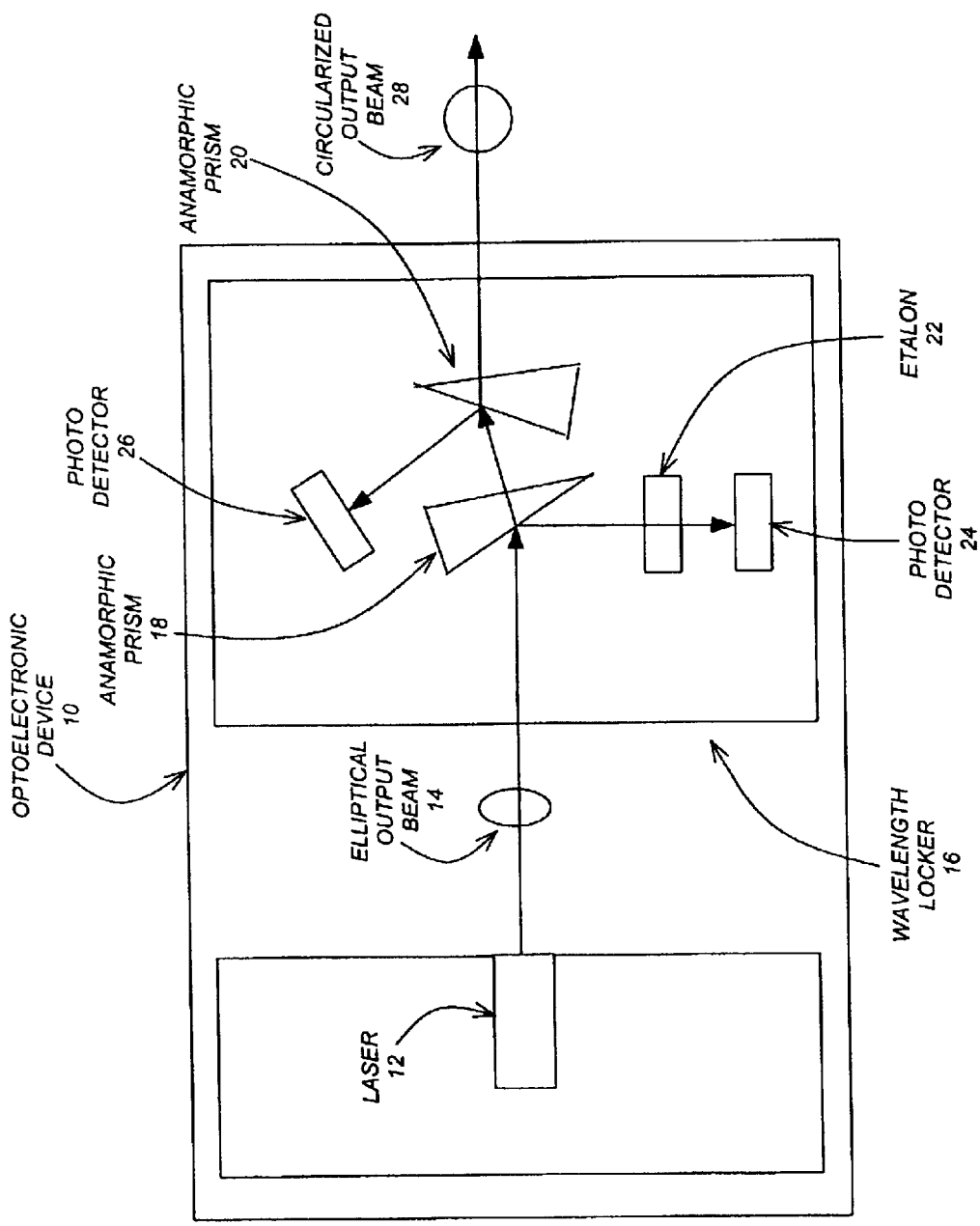
FIG. 1 illustrates the structure of an optoelectronic device according to the preferred embodiment of the present invention.

FIG. 1 illustrates the structure of an optoelectronic device according to the preferred embodiment of the present invention. The optoelectronic device 10 includes a laser 12 that generates an elliptical output beam 14 and a wavelength locker 16. In a preferred embodiment, the wavelength locker 16 includes an air-spaced pair of anamorphic prisms 18 and 20, an etalon 22 and photo-detector 24 for a first beam split off by a first prism 18 of the pair, and a photo-detector 26 for a second beam split off by a second prism 20 of the pair.

The prisms 18 and 20 of the wavelength locker 16 act as beam splitters to tap a small percentage of the optical power of the elliptical output beam 14 for wavelength and power monitoring. Two reflected beams are split off by the prisms 18 and 20 and are spatially separated for wavelength and power monitoring. Of the two beams split off of the elliptical output beam 14, a first split-off beam is transmitted through the etalon 22 to the photo-detector 24 for wavelength monitoring, while a second split-off beam is transmitted to the photo-detector 26 as a reference and for power monitoring.

The reference signal output from the photo-detector 26 is proportional to the optical power incident on the wavelength locker 16, while the wavelength monitoring signal output from the photo-detector 24 is of the form:

$$PD_{etalon}(f) = \frac{A}{\left(1 + F\sin\left(\frac{\pi f}{FSR}\right)^2\right)}$$

where:

$PD_{etalon}(f)$ is the wavelength monitoring signal output from the photo-detector (PD) 24, A is a constant proportional to the output beam 14 power, F is a finesse of the etalon 22 according to $F=4R/(1-R)^2$, FSR is a free spectral range of the etalon 22 according to $FSR=c/(2nL)$, f is an optical frequency of the light, n is an index of refraction of the etalon 22, R is a reflectivity of the surfaces of the etalon 22, L is a thickness of the etalon 22, and c is the speed of light.

In addition to wavelength and power monitoring, the wavelength locker 16 also provides a circularized output beam 28. This is especially useful for edge-emitting diode lasers 12 that generate elliptical output beams 14.

In a preferred embodiment of the present invention, the anamorphic pair of prisms 18 and 20 expands or compresses the elliptical output beam 14 width in a first axis, while leaving the elliptical output beam 14 width in a second axis orthogonal to the first axis unchanged, thereby generating the circularized output beam 28. For single mode fiber coupling, the circularized output beam 28 can be focused with a numerical aperture (NA) that matches the fiber in both the horizontal axis and vertical axis, thereby providing more efficient fiber coupling.

Figure 2:
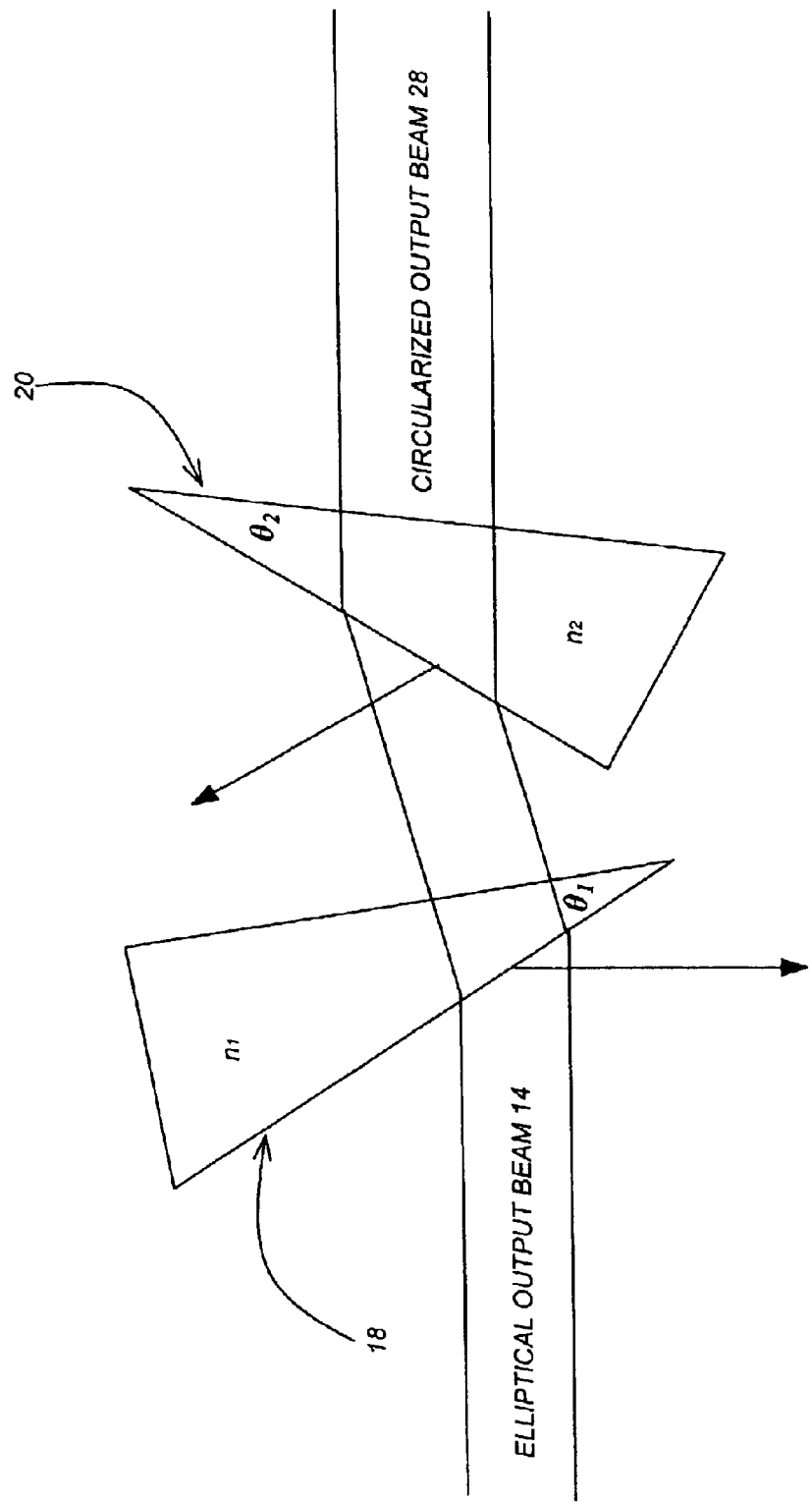
FIG. 2 illustrates how the prisms are constructed to maximize magnification, while minimizing chromatic aberration for fiber coupling.

FIG. 2 illustrates how the prisms 18 and 20 are constructed to maximize magnification, while minimizing chromatic aberration for fiber coupling. This figure also illustrates how two beams are split off for wavelength and power monitoring. In addition, this figure illustrates how the circularized output beam 28 is transmitted parallel to the original optical axis of the laser 12.

In the preferred embodiment, an incident angle on an entrance surface of the first prism 18 should be large, an index of refraction of the glass used for both of the prisms 18 and 20 should be sufficiently high, and an incident angle on an exit surface of the second prism 20 should be small.

The angles of incidence and indices of refraction for the prisms 18 and 20 may be chosen according to the following equation:

$$n_1 \sin(\theta_2) = n_2 \sin(\theta_1)$$

wherein $n_1$ is an index of refraction for the first prism 18, $\theta_1$ is an incident angle on an entrance surface of the first prism 18, $n_2$ is an index of refraction for the second prism 20, and $\theta_2$ is an incident angle on an entrance surface of the second prism 20. However, the preferred embodiment uses an air-spaced pair of prisms 18 and 20 that satisfies the condition:

$$n_1 = n_2 \text{ and } \theta_2 = \theta_1$$

This magnification of the beam at each prism interface of the prism pair is determined by an incident angle $\theta_{incident}$ and a transmitted angle $\theta_{transmitted}$ according to the equation:

$$D_{transmitted} = D_{incident} \frac{\cos(\theta_{transmitted})}{\cos(\theta_{incident})}$$

where $D_{incident}$ is a diameter of the incident beam and $D_{transmitted}$ is a diameter of the transmitted beam.

Figure 3:
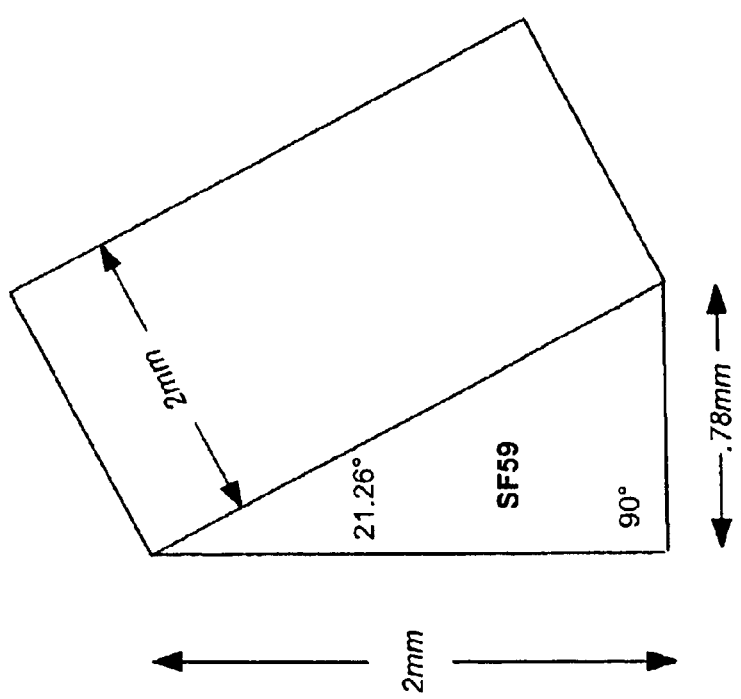
FIGS. 3 and 4 each illustrates an exemplary prism.

FIG. 3 illustrates an exemplary first prism 18 constructed of a glass known as SF59, and placed at an incident angle of 45 degrees to the elliptical output beam 14 with its wavelength near 1.5 μm, wherein the angle $\theta_1$ for maximum magnification would be 21.26 degrees and the magnification would be 1.32×. A comparable second prism 20 would be placed in the beam at an incident angle of −45 degrees relative to the beam exiting the first prism 18 for a total magnification of 1.74×.

Figure 4:
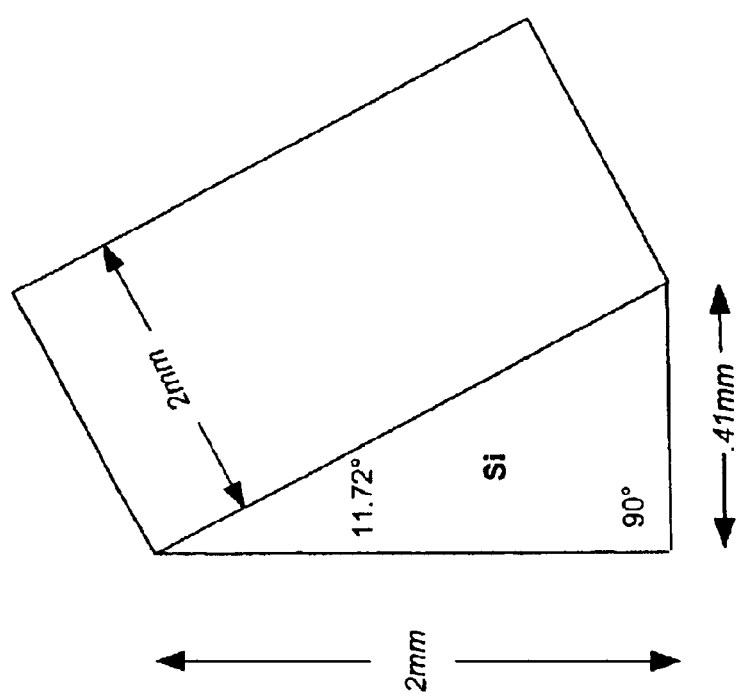

For greater magnification, larger incident angles and optical materials such as silicon (Si) or indium phosphide (InP) with higher indices of refraction may be used. For example, FIG. 4 illustrates an exemplary first prism 18 constructed of silicon (Si) with an index of refraction of 3.48, and placed at an incident angle of 45 degrees to the elliptical output beam 14 with its wavelength near 1.5 μm, wherein the angle $\theta_1$ for maximum magnification would be 11.7 degrees and yield a magnification of 1.38×. A comparable second prism 20 would be placed in the beam at an incident angle of −45 degrees relative to the beam exiting the first prism 18 for a total magnification of 1.91×.

Note that, in cases where it is preferred to reduce the size of the beam, the beam can be propagated in the opposite direction through the prisms, which will reduce the beam by the same magnification factor.

Figure 5:
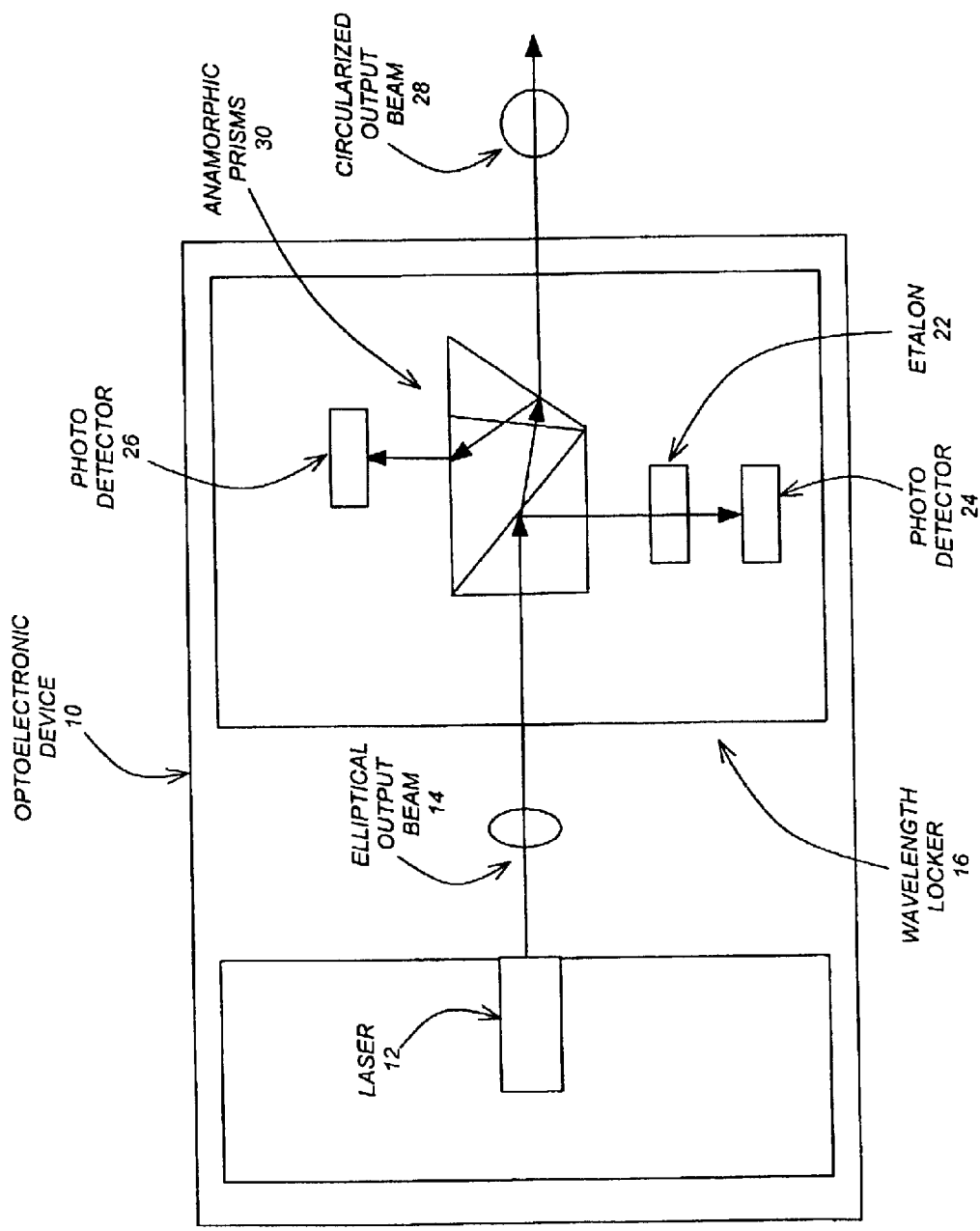
FIG. 5 illustrates an alternative structure for the anamorphic prisms.

FIG. 5 illustrates an alternative structure for the anamorphic prisms. Like, FIG. 1, the optoelectronic device 10 includes a laser 12 that generates an elliptical output beam 14 and a wavelength locker 16. In the alternative embodiment, however, the wavelength locker 16 includes three contacted anamorphic prisms 30, as well as an etalon 22 and photo-detector 24 for a first beam split off by the prisms 30, and a photo-detector 26 for a second beam split off by the prisms 30. Note that the operation of the wavelength locker 16 is the same as in FIG. 1, except for the prism surfaces that perform the beam splitting.

Conclusion

This concludes the description of the preferred embodiment of the invention. The following describes some alternative embodiments for accomplishing the present invention.

For example, different numbers of anamorphic prisms and different configurations of prisms other than those explicitly described herein could be used without departing from the scope of the present invention. In addition, different types of materials, different constructions, different angles and different indices of refraction for the prisms other than those explicitly described herein could be used without departing from the scope of the present invention. Moreover, the prisms could expand and/or compress the output beam in ways other than those explicitly described herein without departing from the scope of the present invention. Finally, other configurations of output beams, other than elliptical output beams, could be conditioned in ways other than those explicitly described herein without departing from the scope of the present invention.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An opto-electronic device, comprising:

a wavelength locker for monitoring and locking a wavelength of an elliptical output beam from a laser and for conditioning the elliptical output beam, wherein the wavelength locker comprises a plurality of prisms, the prisms split off at least a first beam from the elliptical output beam for transmission to a photo-detector for monitoring and locking the wavelength of the elliptical output beam, and the prisms expand or compress the elliptical output beam width in a first axis, while leaving the elliptical output beam width in a second axis orthogonal to the first axis unchanged in order to circularize the elliptical output beam circularize the output beam.

2. The device of claim 1, wherein the prisms split off at least a second beam from the output beam for transmission to another photo-detector as a reference and for monitoring the output beam's power.

3. The device of claim 1, wherein the plurality of prisms comprise an air-spaced pair of prisms.

4. The device of claim 1, wherein the plurality of prisms comprise three contacted prisms.

5. The device of claim 1, wherein indices of refraction and internal angles for the prisms are chosen according to:

$$n_1 \sin(\theta_2) = n_2 \sin(\theta_1)$$

wherein $n_1$, is an index of refraction for a but prism, $\theta_1$, is the internal angle of the first prism, $n_2$ is an index of refraction for a second prism, and $\theta_2$ is the internal angle of the second prism.

6. A method for monitoring, locking and conditioning an elliptical output beam from a laser, comprising:

monitoring and locking a wavelength of an elliptical output beam from a laser using a wavelength locker; and conditioning the elliptical output beam using the wavelength locker;

wherein the wavelength locker comprises a plurality of prisms, the prisms split off at least a first beam from the elliptical output beam for transmission to a photo-detector for monitoring and locking the wavelength of the output beam, and the prisms expand or compress the elliptical output beam width in a first axis, while leaving the elliptical output beam width in a second axis orthogonal to the first axis unchanged in order to circularize the elliptical output circularize the output beam.

7. The method of claim 6, wherein the prisms split off at least a second beam from the output beam for transmission to another photo-detector as a reference and for monitoring the output beam's power.

8. The method of claim 6, wherein the plurality of prisms comprise an air-spaced pair of prisms.

9. The method of claim 6, wherein the plurality of prisms comprise three contacted prisms.

10. The method of claim 6, wherein indices of refraction and internal angles for the prisms are chosen according to:

$$n_1 \sin(\theta_2) = n_2 \sin(\theta_1)$$

wherein $n_1$ is an index of refraction for a first prism, $\theta_1$ is the internal angle of the first prism, $n_2$ is an index of refraction for a second prism, and $\theta_2$ is the internal angle of the second prism.

11. An opto-electronic device, comprising:

a laser for generating an elliptical output beam; and a wavelength locker for monitoring and locking a wavelength of the elliptical output beam from the laser and for conditioning the elliptical output beam, wherein the wavelength locker comprises a plurality of prisms, the prisms spilt off at least a first beam from the elliptical output beam for transmission to a photo-detector for monitoring and locking the wavelength of the elliptical output beam, and the prisms expand or compress the elliptical output beam width in a first axis, while leaving the elliptical output beam width in a second axis orthogonal to the first axis unchanged in order to circularize the elliptical output beam circularize the elliptical output beam.

12. The device of claim 11, wherein the prisms split off at least a second beam from the output beam for transmission to another photo-detector as a reference and for monitoring the output beam's power.

13. The device of claim 11, wherein the plurality of prisms comprise an air-spaced pair of prisms.

14. The device of claim 11, wherein the plurality of prisms comprise three contacted prisms.

15. The device of claim 11, wherein indices of refraction and internal angles for the prisms are chosen according to:

$$n_1 \sin(\theta_2) = n_2 \sin(\theta_1)$$

wherein $n_1$ is an index of refraction for a first prism, $\theta_1$ is the internal angle of the first prism, $n_2$ is an index of refraction for a second prism, and $\theta_2$ is the internal angle of the second prism.

* * * * *

UNITED STATES PATENT AND TRADEMARK OFFICE
CERTIFICATE OF CORRECTION

PATENT NO. : 6,765,940 B2
DATED : July 20, 2004
INVENTOR(S) : Bradley W. Short

It is certified that error appears in the above-identified patent and that said Letters Patent is hereby corrected as shown below:

Column 5,
Line 28, "but" should read -- first --.
Line 47, delete second occurrence of "circularize the output".

Column 6,
Line 22, "spilt" should read -- split --.
Line 29, delete second occurrence of "circularize the elliptical output beam".

Signed and Sealed this

Twenty-first Day of December, 2004

JON W. DUDAS
*Director of the United States Patent and Trademark Office*